(12) United States Patent
Kwon et al.

(10) Patent No.: US 11,314,352 B2
(45) Date of Patent: Apr. 26, 2022

(54) FLEXIBLE DISPLAY MODULE AND IMAGE DISPLAY DEVICE INCLUDING THE SAME

(71) Applicant: DONGWOO FINE-CHEM CO., LTD., Jeollabuk-do (KR)

(72) Inventors: Hye Rim Kwon, Incheon (KR); Dong Jin Son, Chungcheongnam-do (KR); Jin Woo Lee, Seoul (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 17/145,648

(22) Filed: Jan. 11, 2021

(65) Prior Publication Data
US 2021/0132724 A1 May 6, 2021

Related U.S. Application Data

(63) Continuation of application No. PCT/KR2019/005918, filed on May 17, 2019.

(30) Foreign Application Priority Data

Jul. 13, 2018 (KR) .......................... 10-2018-0081404

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H01L 27/323* (2013.01);
(Continued)

(58) Field of Classification Search
CPC ... G06F 3/0412; G06F 3/0446; H01L 27/323; H01L 27/3244; H01L 51/0097; H01L 51/524; H01L 51/5281
(Continued)

(56) References Cited

U.S. PATENT DOCUMENTS 9,780,121 B2* 10/2017 Watanabe ............. G06F 3/0445
10,635,212 B2* 4/2020 Hong .................... G06F 3/0412
(Continued)

FOREIGN PATENT DOCUMENTS

| KR | 10-2015-0078001 A | 7/2015 |
| KR | 10-2017-0121037 A | 11/2017 |
| WO | WO 2013/063176 A1 | 5/2013 |

OTHER PUBLICATIONS

International Search Report for PCT/KR2019/005918 dated Aug. 26, 2019.

*Primary Examiner* — Prabodh M Dharia
(74) *Attorney, Agent, or Firm* — The PL Law Group, PLLC (57) ABSTRACT

A flexible display module according to an embodiment of the present invention includes a display panel, a touch sensor layer disposed on the display panel, the touch sensor layer including sensing electrodes and traces that extend from the sensing electrodes, a combining layer by which the display panel and the touch sensor layer are combined with each other, the combining layer having an elastic modulus in a range from 0.1 to 5 MPa and a moisture permeability in a range from 500 g/m²·24 hr or less, a flexible circuit board electrically connected to the traces at an end portion of the touch sensor layer, and an upper supporting structure that commonly and partially covers the flexible circuit board and the touch sensor layer. End portions of the display panel and the touch sensor layer are bent together with the upper supporting structure.

18 Claims, 4 Drawing Sheets

(51) Int. Cl.
　　　*H01L 27/32*　　　(2006.01)
　　　*H01L 51/00*　　　(2006.01)
　　　*H01L 51/52*　　　(2006.01)
(52) U.S. Cl.
　　　CPC ...... *H01L 27/3244* (2013.01); *H01L 51/0097* (2013.01); *H01L 51/524* (2013.01); *H01L 51/5281* (2013.01); *G06F 2203/04102* (2013.01); *H01L 2251/5338* (2013.01)
(58) Field of Classification Search
　　　USPC .......................................... 345/174; 524/850
　　　See application file for complete search history.

(56) References Cited

U.S. PATENT DOCUMENTS

| | | |
|---|---|---|
| 2009/0051640 A1 | 2/2009 | Tanaka et al. |
| 2012/0225997 A1* | 9/2012 | Niwa ........................ C09J 7/385 |
| | | 524/850 |
| 2014/0217382 A1 | 8/2014 | Kwon et al. |
| 2016/0207285 A1* | 7/2016 | Seki ........................ C23C 16/345 |
| 2016/0244565 A1 | 8/2016 | Katayama et al. |
| 2020/0192510 A1* | 6/2020 | Liu ........................ B32B 27/285 |

* cited by examiner

FLEXIBLE DISPLAY MODULE AND IMAGE DISPLAY DEVICE INCLUDING THE SAME

CROSS REFERENCE TO RELATED APPLICATIONS AND CLAIM OF PRIORITY

The present application is a continuation application to International Application No. PCT/KR2019/005918 with an International Filing Date of May 17, 2019, which claims the benefit of Korean Patent Application No. 10-2018-0081404 filed on Jul. 13, 2018 at the Korean Intellectual Property Office, the disclosures of which are incorporated by reference herein in their entirety.

BACKGROUND

1. Field

The present invention relates to a flexible display module and an image display device including the same. More particularly, the present invention related to a flexible display module combined with a touch sensor and an image display device including the same

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

As a flexible display capable of being bent or folded is being developed, the touch sensor having proper properties, structures and constructions for being applied to the flexible display is also needed.

For example, when the touch sensor is bent or folded, a delamination of layers around the touch sensor, damages to electrodes or connection wiring, etc., may occur. Additionally, when the touch sensor is bent to connect the touch sensor to a circuit, a degree of bending may be increased to expand a dimension of a display area. In this case, the delamination and mechanical damages may further severely occur.

For example, a touch sensor or a touch screen panel combined with various image display devices are being developed as disclosed in Korean Patent Published Publication No. 2014-0092366.

SUMMARY

According to an aspect of the present invention, there is provided a flexible display module having improved electrical and mechanical reliability and flexibility.

According to an aspect of the present invention, there is provided an image display device including a flexible display module having improved electrical and mechanical reliability and flexibility.

(1) A flexible display module, including: a display panel; a touch sensor layer disposed on the display panel, the touch sensor layer including sensing electrodes and traces that extend from the sensing electrodes; a combining layer by which the display panel and the touch sensor layer are combined with each other, the combining layer having an elastic modulus in a range from 0.1 to 5 MPa and a moisture permeability in a range from 500 $g/m^2 \cdot 24$ hr or less; a flexible circuit board electrically connected to the traces at an end portion of the touch sensor layer; and an upper supporting structure that commonly and partially covers the flexible circuit board and the touch sensor layer, wherein end portions of the display panel and the touch sensor layer are bent together with the upper supporting structure.

(2) The flexible display module according to the above (1), wherein the combining layer includes an adhesive layer formed from an acrylic monomer mixture.

(3) The flexible display module according to the above (1), wherein the elastic modulus of the combining layer is in a range from 0.5 to 2 MPa.

(4) The flexible display module according to the above (1), wherein the moisture permeability of the combining layer is in a range from 10 to 200 $g/m^2 \cdot 24$ hr.

(5) The flexible display module according to the above (1), wherein the combining layer has an adhesive force of 1 N/25 mm or more.

(6) The flexible display module according to the above (1), wherein a thickness of the combining layer is greater than each thickness of the display panel and the touch sensor layer.

(7) The flexible display module according to the above (1), wherein a thickness of the combining layer is in a range from 5 to 100 μm.

(8) The flexible display module according to the above (1), wherein the touch sensor layer includes an active area in which the sensing electrodes are arranged and a trace area in which the traces are arranged, and a bending is initiated from a portion of the active area adjacent to the trace area.

(9) The flexible display module according to the above (8), wherein a curvature of bent portions of the display panel and the touch sensor layer is in a range from 0.1R to 0.5R with respect to a radius of curvature R.

(10) The flexible display module according to the above (8), wherein the active area includes a display area, and the bending initiated from a portion of the active area between the display area and the trace area.

(11) The flexible display module according to the above (10), further including an optical layer selectively disposed on the display area of the touch sensor layer.

(12) The flexible display module according to the above (11), wherein the upper supporting structure covers the trace area and a portion of the active area on which the optical layer is not formed.

(13) The flexible display module according to the above (11), wherein the end portions of the display panel and the touch sensor layer are bent such that the flexible circuit board and the optical layer face each other.

(14) The flexible display module according to the above (13), further comprising a lower supporting structure disposed between portions of the display panel that overlap the optical layer and the flexible circuit board facing each other.

(15) The flexible display module according to the above (11), wherein the optical layer includes at least one of a polarizer, a polarizing plate, a retardation film, a reflective sheet, a brightness enhancing film or a refractive index matching film.

(16) The flexible display module according to the above (1), wherein the display panel includes an organic light emitting diode (OLED) panel.

(17) An image display device, comprising: the flexible display module according to any one of the above (1) to (16); and a window substrate disposed on the flexible display module.

(18) The image display device according to the above (17), further including a main board disposed under the flexible display module, wherein the flexible circuit board of the flexible display module is electrically connected to the main board.

In a flexible display module according to embodiments of the present invention, a display panel and a touch sensor layer may be integrated by a combining layer. The touch sensor layer may be fabricated as, e.g., a substrate-less type thin film to be combined with the display panel. Accordingly, the display panel and the touch sensor layer may be bent together to reduce an area of a bezel portion or a light-shielding portion and to expand an area of a display region.

The combining layer may have a predetermined range of a thickness, an elastic modulus, an adhesive force and a moisture permeability. Accordingly, even when being bent to a radius of curvature of, e.g., about 0.5R or less, a highly reliable circuit connection may be implemented without deteriorating durability due to interlayer delamination and moisture permeation.

The flexible display module may include a supporting structure that may hold the touch sensor layer and the display panel while being bent. When the flexible display module is folded or bent, a peel-off of a flexible printed circuit board may be prevented, and damages to the sensing electrodes or traces in a bending area may be prevented.

DETAILED DESCRIPTION

According to exemplary embodiments of the present invention, there is provided a touch sensor module that includes a display panel a touch sensor layer integrated by a combining layer, a flexible circuit board connected to an end portion of the touch sensor layer, and a supporting structure fixing or holding the touch sensor layer and the display panel so that the display panel and the touch sensor layer may be bent together.

According to exemplary embodiments of the present invention, an image display device including the flexible display module is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, for example, two directions being parallel to a top surface of a display panel and a touch sensor layer and perpendicular to each other are defined as a first direction and a second direction. For example, the first direction may correspond to a length direction of the flexible display module, and the second direction may correspond to a width direction of the flexible display module. Additionally, a direction vertical to the first and second directions may be defined as a third direction. For example, the third direction may correspond to a thickness direction of the flexible display module.

Figure 1:
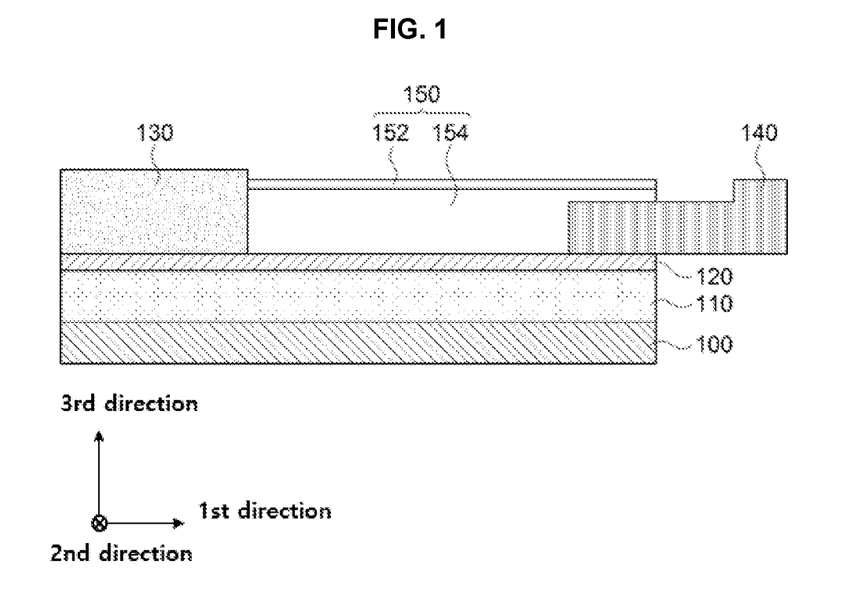
FIGS. 1 and 2 are schematic cross-sectional views illustrating a flexible display module in accordance with exemplary embodiments.
Figure 2:
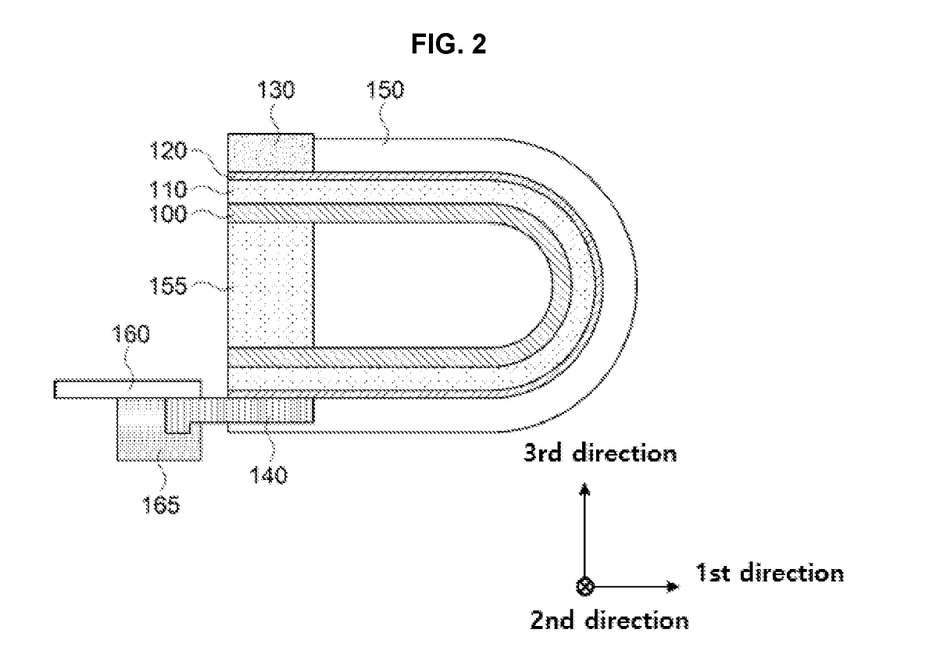

FIGS. 1 and 2 are schematic cross-sectional views illustrating a flexible display module in accordance with exemplary embodiments.

Referring to FIG. 1, the flexible display module includes a display panel 100, a combining layer 110 and a touch sensor layer 120, and may include a flexible circuit board 140 connected to an end portion of the touch sensor layer 120, and an upper supporting structure 150 that may partially cover the flexible circuit board 140 and the touch sensor layer 120.

The display panel 100 may include, e.g., a liquid crystal display (LCD) panel or an organic light emitting diode (OLED) display panel. Preferably, the display panel 100 may include an OLED panel. A back-plane structure such as a backlight unit may be omitted in the OLED panel, so that bending or folding with the touch sensor layer 120 may be easily implemented as described with reference to FIG. 2 below.

Elements and constructions of the display panel 100 will be described later in more detail with reference to FIG. 5.

The combining layer 110 may be formed on a top surface of the display panel 100. For example, the combining layer 110 may be formed on an upper encapsulation layer of the display panel 100.

In exemplary embodiments, the combining layer 110 may include an acrylic, urethane or rubber-based adhesive material. Preferably, the combining layer 110 may be formed by a photo-curing process after applying a photo-curable composition obtained by mixing a photo-polymerization initiator to an acrylic syrup prepared from an acrylic monomer mixture.

The acrylic monomer mixture may include, e.g., a (meth)acrylate having a linear or branched alkyl group having 1 to 20 carbon atoms, or a (meth)acrylate having an alicyclic alkyl group. The term "(meth)acrylate" used herein includes both acrylate and methacrylate.

Non-limiting examples of the (meth)acrylate having the linear or branched alkyl group may include methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, isopentyl (meth)acrylate, hexyl (meth) acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl(meth)acrylate, isodecyl(meth)acrylate, undecyl(meth)acrylate, dodecyl(meth)acrylate, tridecyl(meth)acrylate, tetradecyl (meth)acrylate, pentadecyl(meth)acrylate, hexadecyl (meth)acrylate, heptadecyl (meth)acrylate, octadecyl (meth)acrylate, nonadecyl (meth)acrylate, eicosyl (meth)acrylate, etc. These may be used alone or in a combination of two or more therefrom.

Non-limiting examples of the (meth)acrylate having the alicyclic alkyl group may include trimethylcyclohexyl (meth)acrylate, t-butyl cyclohexyl (meth)acrylate, dicyclopentadiene (meth)acrylate, trimethylcyclohexyl (meth)acrylate, cyclohexyl (meth)acrylate, isobornyl (meth)acrylate, tetrahydrofurfuryl (meth)acrylate, 3,3,5-trimethylcyclohexyl (meth)acrylate, 4-t-butyl cyclohexyl (meth)acrylate, etc. These may be used alone or in a combination of two or more therefrom.

The acrylic monomer mixture may further include a polar monomer such as a hydroxyl group-containing monomer or a carboxyl group-containing monomer.

Examples of the hydroxy group-containing monomer may include 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, 2-hydroxyethylene glycol (meth)acrylate, 2-hydroxypropylene glycol (meth)acrylate, hydroxyalkylene glycol (meth)acrylate containing an alkylene group having 2-4 carbon atoms, 4-hydroxybutyl vinyl ether, 5-hydroxypentyl vinyl ether, 6-hydroxyhexyl vinyl ether, 7-hydroxyheptyl vinyl ether, 8-hydroxyoctyl vinyl ether, 9-hydroxynonyl vinyl ether, etc.

Examples of the carboxy group-containing monomer may include (meth)acrylic acid, crotonic acid, maleic acid, itaconic acid, fumaric acid, 3-(meth)acryloylpropionic acid, and a succinic anhydride ring-opening adduct of a (meth)acrylate-based compound.

The photo-polymerization initiator may include an initiator widely known in the art which may initiate a photo-polymerization by generating a radical by a UV irradiation, etc., and may include a benzoin-based initiator, a hydroxyketone-based initiator, an amino ketone-based initiator and/or a phosphine oxide-based initiator.

Non-limiting examples of the photo-polymerization initiator may include 2,2-dimethoxy-1,2-diphenylethan-1-one, diphenyl (2,4,6-trimethylbenzoyl) phosphine oxide, hydroxy cyclohexyl phenyl ketone, hydroxy methylphenyl propanone, benzoyl formic acid, 1,4-dibenzoylbenzene, etc.

The photo-curable composition may further include various known additives, such as a crosslinking agent, a light stabilizer, a silane coupling agent, etc., within a range that may not degrade adhesive, durable and elastic properties of the combining layer 110.

An elastic modulus (e.g., a storage modulus), an adhesive force and a moisture permeability of the combining layer 110 may be adjusted by, e.g., controlling types and contents of the monomers contained in the photo-curable composition, and an irradiation amount of an ultraviolet light during the photo-curing process.

In exemplary embodiments, the combining layer 110 may have an elastic modulus from about 0.1 to 5 MPa. If the elastic modulus of the combining layer 110 exceeds about 5 MPa, a bending corresponding to a curvature of about 0.5R or less may not be easily implemented. If the elastic modulus of the combining layer 110 is less than about 0.1 MPa, a sufficient resistance to a flexural stress may not be achieved. Preferably, the elastic modulus of the combining layer 110 may be from about 0.5 to 2 MPa.

In exemplary embodiments, the moisture permeability of the combining layer 110 may be from about 500 g/m²·24 hr or less. In the above range, penetration of moistures from an outside may be sufficiently prevented when a layer deformation occurs due to a bending stress. Preferably, the moisture permeability of the combining layer 110 may be about 200 g/m²·24 hr or less.

If the moisture permeability of the combining layer 110 is excessively small, previously penetrated moistures may not be easily diffused and removed. Accordingly, in an embodiment, the moisture permeability of the combining layer 110 may be adjusted to about 10 g/m²·24 hr or more.

In some embodiments, an adhesive force of the combining layer 110 may be about 1 N/25 mm or more. In the above range, mechanical stability may be sufficiently obtained without causing an interlayer delamination between the display panel 100 and the touch sensor layer 120 when bending is applied. Preferably, the adhesive force of the combining layer 110 may be about 5 N/25 mm or more.

The touch sensor layer 120 may be stacked on the combining layer 110. The touch sensor layer 120 may be attached on the display panel 100 via the combining layer 110. Accordingly, the display panel 100 and the touch sensor layer 120 may be integrated into a single module.

The touch sensor layer 120 may include conductive patterns such as a sensing electrode, a trace extending from the sensing electrode, etc., and may further include an insulating layer for a mutual insulation of the conductive patterns. Elements and constructions of the touch sensor layer 120 will be described later in more detail with reference to FIGS. 3 and 4.

In exemplary embodiments, the touch sensor layer 120 may be manufactured as a substantially substrate-less type. For example, an intermediate layer may be formed on a carrier substrate, and the sensing electrode and the trace may be formed on the intermediate layer. Thereafter, after the carrier substrate is removed from the intermediate layer, the touch sensor layer may be directly attached to the display panel 100 by the combining layer 110.

The intermediate layer may include a polymer organic layer capable of promoting a peel-off from the carrier substrate. Non-limiting examples of the intermediate layer may include a polyimide-based polymer, a polyvinyl alcohol-based polymer, a polyamic acid-based polymer, a polyamide-based polymer, a polyethylene-based polymer, a polystyrene-based polymer, a polynorbornene-based polymer, a phenylmaleimide copolymer-based polymer, a polyazobenzene-based polymer, a polyphenylenephthalamide-based polymer, a polyester-based polymer, a polymethyl methacrylate-based polymer, a polyarylate-based polymer, a cinnamate-based polymer, a coumarin-based polymer, a phthalimidine-based polymer, a chalcone-based polymer, an aromatic acetylene-based polymer, etc. These may be used alone or in a combination of two or more therefrom.

The flexible printed circuit board (FPCB) 140 may disposed on an end portion of the touch sensor layer 120 and may be electrically connected to the traces included in the touch sensor layer 120. In an embodiment, a terminal portion or a pad portion formed at an end of the trace and a circuit wiring included in the flexible circuit board 140 may be electrically connected to each other by a conductive intermediate structure such as an anisotropic conductive film (ACF).

The flexible circuit board 140 may include, e.g., a core layer including a resin or a liquid crystal polymer, and the circuit wiring printed on the core layer. The flexible circuit board 140 may further include a coverlay layer covering the circuit wiring on the core layer. A portion of the coverlay layer may be removed to expose a portion of the circuit wiring connected to the terminal portion or the pad portion of the touch sensor layer 120.

The touch sensor layer 120 may further include a passivation layer protecting the sensing electrode and traces. In this case, a portion of the passivation layer formed on a connection area in which the flexible circuit board 140 and the traces of the touch sensor layer 120 are connected may be removed.

The upper supporting structure 150 may be formed on a portion of the flexible circuit board 140 and a portion of the touch sensor layer 120 disposed on the connection area. Accordingly, the upper supporting structure 150 may commonly and partially cover end portions of the touch sensor layer 120 and the flexible circuit board 140.

The upper supporting structure 150 may suppress a peel-off of the flexible circuit board 140 caused by an external stress in the connection area, and may serve as a protective pattern preventing damages such as delamination, cracks, etc., of the sensing electrode or the trace during a folding or bending operation.

The upper supporting structure 150 may have a multi-layered structure. For example, the upper supporting structure 150 may include a substrate layer 152 and a supporting layer 154 formed on a surface of the substrate layer 152. The supporting layer 154 may include, e.g., acrylic-based, silicone-based, urethane-based and/or rubber-based adhesive materials, and may contact and hold end portions of the flexible circuit board 140 and the touch sensor layer 120 on the connection area.

The substrate layer 152 may include, e.g., a polymer film. For example, the polymer film may include cyclic olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), cellulose acetate propionate (CAP), polyethersulfone (PES), cellulose triacetate (TAC), polycarbonate (PC), cyclic olefin copolymer (COC), polymethylmethacrylate (PMMA), or the like.

The touch sensor module may further include an optical layer 130. The optical layer 130 may include a film or a layer structure widely known in the related art for improving an image visibility implemented from pixels of the display panel 100. Non-limiting examples of the optical layer 130 may include a polarizing plate, a polarizer, a retardation film, a reflective sheet, a luminance enhancing film, a refractive index matching film, etc. These may be used alone or in a multi-layered structure including at least two thereof.

In exemplary embodiments, the optical layer 130 may be substantially superimposed over a display area of the display panel 100 or the touch sensor layer 120. The optical layer 130 may be located at the same layer or at the same level as that of the upper supporting structure 150. The upper supporting structure 150 may extend from a portion of the touch sensor layer 120 exposed to an outside of the optical layer 130 to a portion of a top surface of the flexible circuit board 140.

In some embodiments, an adhesive layer for attaching the optical layer 130 may be further formed on a top surface of the touch sensor layer 120.

Referring to FIG. 2, an end portion (e.g., an end portion in the first direction) of the flexible display module to which the flexible circuit board 140 is coupled may be bent and disposed under the optical layer 130.

As illustrated in FIG. 2, end portions of the display panel 100 and the touch sensor layer 120 that do not overlap the optical layer 130 may be integrated by the combining layer 110 and bent together. The end portions may be bent in the third direction and extend again in the first direction to face the optical layer 130 in the third direction. Accordingly, the flexible circuit board 140 may be disposed under the optical layer 130 to be electrically connected to a main board 160 disposed under the display panel 100. For example, the flexible circuit board 140 and a diving circuit included in the main board 160 may be connected through a bonding pad 165 formed on a bottom surface of the main board 160. Accordingly, the driving circuit and the trace included in the touch sensor layer 120 may be electrically connected to each other so that a touch sensing signal/a driving signal may be mutually transferred In exemplary embodiments, the upper supporting structure 150 may be bent together with the curved end portions of the display panel 100 and the touch sensor layer 120. Accordingly, a peel-off of the touch sensor layer 120 due to a bending stress and damages to electrodes and wirings may be prevented. Further, the flexible circuit board 140 may be fixed by the upper supporting structure 150 during the bending operation. Thus, a connection between the flexible circuit board 140 and the traces of the touch sensor layer 120 in the connection area may be stably maintained.

Additionally, the combining layer 110 may be continuously formed between the curved end portions of the display panel 100 and the touch sensor layer 120 and may be bent together, so that the display panel 100 and the touch sensor layer 120 may be integrated while being bent.

In some embodiments, a curvature of the curved area or the curved portion of the display panel 100 and the touch sensor layer 120 may be from about 0.1R to 0.5R (R refers to a radius of curvature). Even when a sharp curvature of about 0.5R or less is applied, delamination and mechanical damages of the touch sensor layer 120 and the display panel 100 may be prevented by the upper supporting structure 150 and the combining layer 110.

As described above, the combining layer 110 may have the elastic modulus, the adhesive force and the moisture permeability within the predetermined ranges. Accordingly, penetration of external moistures generated in the curved portion may be prevented, and oxidation and delamination of the electrodes and the wirings in the curved portion may be prevented. Bonding stability and reliability of the display panel 100 and the touch sensor layer 120 may be also enhanced while maintaining the curvature within the above range.

In some embodiments, a thickness of the combining layer 110 may be greater than each thickness of the touch sensor layer 120 and the display panel 100 to maintain a bending reliability. A thickness of the upper supporting structure 150 may also be greater than each thickness of the touch sensor layer 120 and the display panel 100.

In an embodiment, the thickness of the combining layer 110 may be from about 5 to 100 μm, preferably from about 20 to 50 μm.

In an embodiment, the thickness of the touch sensor layer 120 may be smaller than each thickness of the display panel 100 and the optical layer 130. Thus, the bending with the curvature in the above-described range may be easily implemented. As described above, the touch sensor layer 120 may be included as the substrate-less type thin film.

In some embodiments, a lower supporting structure 155 may be disposed between the bent end portion of the display panel 100 and a non-bent portion of the display panel 100 under the optical layer 130.

The lower supporting structure 155 may include, e.g., PSA-based, OCA-based, or rubber-based adhesive materials, and may fix portions of the display panel 100 that may be bent to face each other, thereby maintaining the bending reliability.

Figure 3:
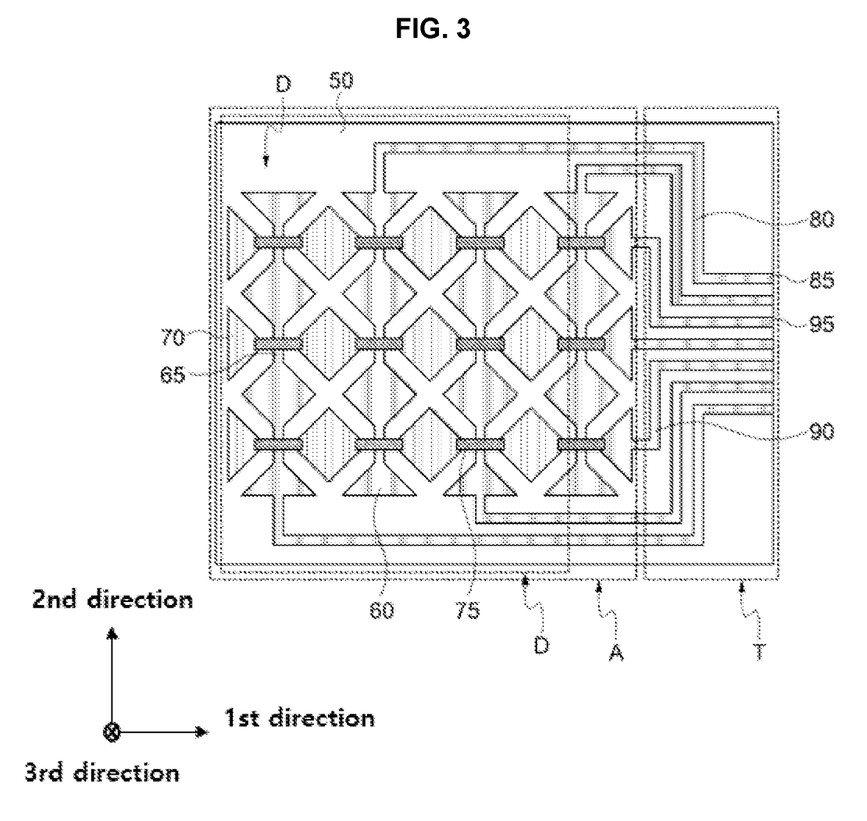
FIG. 3 is a schematic top-planar view illustrating a touch sensor module in accordance with exemplary embodiments.

FIG. 3 is a schematic top-planar view illustrating a touch sensor module in accordance with exemplary embodiments.

Referring to FIG. 3, the touch sensor layer 120 may include sensing electrodes 60 and 70, and traces 80 and 90. In exemplary embodiments, the sensing electrodes 60 and 70 may be arranged to be operable by a mutual capacitance-type.

The sensing electrodes 60 and 70 and the traces 80 and 90 may be arranged on an intermediate layer 50. As described above, the intermediate layer 50 may be included for, e.g., a detachment from the carrier substrate, and may include an organic polymer material.

The touch sensor layer 120 may include an active area A and a trace area T. The active area A may be an area from which a user's touch may be input and sensed by the sensing electrodes 60 and 70. The traces 80 and 90 branching from the sensing electrodes 60 and 70 may be disposed in the trace area T, and a portion of the trace area T may serve as a connection area for the electrical connection with the flexible circuit board 140.

The active area A may include a display area D. For example, the display area D may correspond to a central portion of the active area A. The display area D may be an area from which an image of the image display device may be implemented to the user. In exemplary embodiments, an area where the optical layer 130 illustrated in FIG. 1 overlaps may correspond to the display area D.

The sensing electrodes 60 and 70 may be arranged in the active area D of the touch sensor layer. In exemplary embodiments, the sensing electrodes 60 and 70 may include first sensing electrodes 60 and second sensing electrodes 70.

The first sensing electrodes 60 may be arranged, e.g., along the second direction (e.g., a width direction). Accordingly, a first sensing electrode row extending in the second direction may be formed by a plurality of the first sensing electrodes 60. A plurality of the first sensing electrode rows may be arranged along the first direction.

In some embodiments, the first sensing electrodes 60 neighboring in the second direction may be physically or electrically connected to each other by a connecting portion 65. For example, the connecting portion 65 may be integrally formed with the first sensing electrodes 60 at the same level as that of the first sensing electrodes 60.

The second sensing electrodes 70 may be arranged along the first direction (e.g., a length direction). In some embodiments, the second sensing electrodes 70 may each be physically separated into unit electrodes of an island type. In this case, the second sensing electrodes 70 neighboring in the first direction may be electrically connected to each other by a bridge electrode 75.

A plurality of the second sensing electrodes 70 may be connected to each other by the bridge electrodes 75 and may be arranged in the first direction such that a second sensing electrode column extending in the first direction may be formed. Further, a plurality of the second sensing electrode columns may be arranged along the second direction.

The sensing electrodes 60 and 70 and/or the bridge electrode 75 may include a metal, an alloy or a transparent conductive oxide.

For example, the sensing electrodes 60 and 70 and/or the bridge electrode 75 may be formed of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), or an alloy thereof (e.g., a silver-palladium-copper (APC) alloy). These may be used alone or in a combination thereof.

The sensing electrodes 60 and 70 and/or the bridge electrode 75 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 60 and 70 and/or the bridge electrode 75 may have a multi-layered structure including a transparent conductive oxide layer and a metal layer. For example, the sensing electrodes 60 and 70 and/or the bridge electrode 75 may have a triple-layered structure of a transparent conductive oxide layer-metal layer-transparent conductive oxide layer. In this case, flexible properties may be improved and resistance may be reduced by the metal layer while corrosion resistance and transparency may be improved by the transparent conductive oxide layer.

In some embodiments, the bridge electrode 75 may be formed on an insulation layer (not illustrated). The insulation layer may at least partially cover the connecting portion 65 included in the first sensing electrode row, and at least partially cover the second sensing electrodes 70 around the connecting portion 65. The bridge electrode 75 may penetrate through the insulation layer and may be electrically connected to the second sensing electrodes 70 adjacent to each other with the connecting portion 65 interposed therebetween.

The insulation layer may include an inorganic insulation material such as a silicon oxide or a silicon nitride, or an organic insulation material such as an acrylic resin or a siloxane resin.

The traces 80 and 90 may include a first trace 80 extending from each of the first sensing electrode rows and a second trace 90 extending from each of the second sensing electrode columns.

As illustrated in FIG. 3, the traces 80 and 90 may extend from a periphery of the display area D and be collected in the trace area T.

For example, the first trace 80 may be branched from each of the first sensing electrode rows from both lateral portions of the touch sensor layer and may extend in the first direction. The first traces 80 may be bent while entering the trace area T to extend in the second direction. The first traces 80 may be bent again in the first direction to extend in the first direction in the connection area.

In some embodiments, the first traces 80 may be alternately distributed on both lateral portions of the touch sensor layer. The first traces 80 may be evenly distributed on both lateral portions of the touch sensor layer 120 so that stress generated during the bending operation may be uniformly dispersed. Additionally, the first traces 80 may be alternately arranged on the both lateral portions so that an alignment margin between the neighboring first traces 80 may be increased.

The second traces 90 may each be branched from each second sensing electrode column and may extend in the second direction in the trace area T. The second traces 90 may be bent again in the first direction to extend in the first direction to the connection area.

End portions of the traces 80 and 90 may serve as connecting portions that may be collected in the connection area and electrically connected to the flexible circuit board 140. A first connecting portion 85 and a second connecting potion 95 may be defined by the end portions of the first trace 80 and the second trace 90, respectively, and may be disposed in the connection area.

The traces 80 and 90 may include a conductive material substantially the same as or similar to that of the sensing electrodes 60 and 70.

In exemplary embodiments, the flexible circuit board 140 may be electrically connected to the connecting portions 85 and 95 on the connection area. In some embodiments, a conductive intermediate structure such as an anisotropic conductive film (ACF) may be disposed between the flexible circuit board 140 and the connecting portions 85 and 95.

The upper supporting structure 150 illustrated in FIGS. 1 and 2 may cover the trace area T in a planar view and may cover a portion of the active area A. In exemplary embodiments, a portion of the active area A between the display area D and the trace area T may be covered by the upper supporting structure 150.

The portion of the active area A covered by the upper supporting structure 150 (e.g., the active area A part not covered by the optical layer 130) may be bent together with the trace area T as illustrated in FIG. 2.

A portion of the active area A which may be substantially provided as a bezel portion or a non-display region may be bent together with the display panel 100 so that an area of the bezel portion visible to the user may be reduced. Accordingly, even when a total area of the image display device is reduced, the display area D may be expanded.

Figure 4:
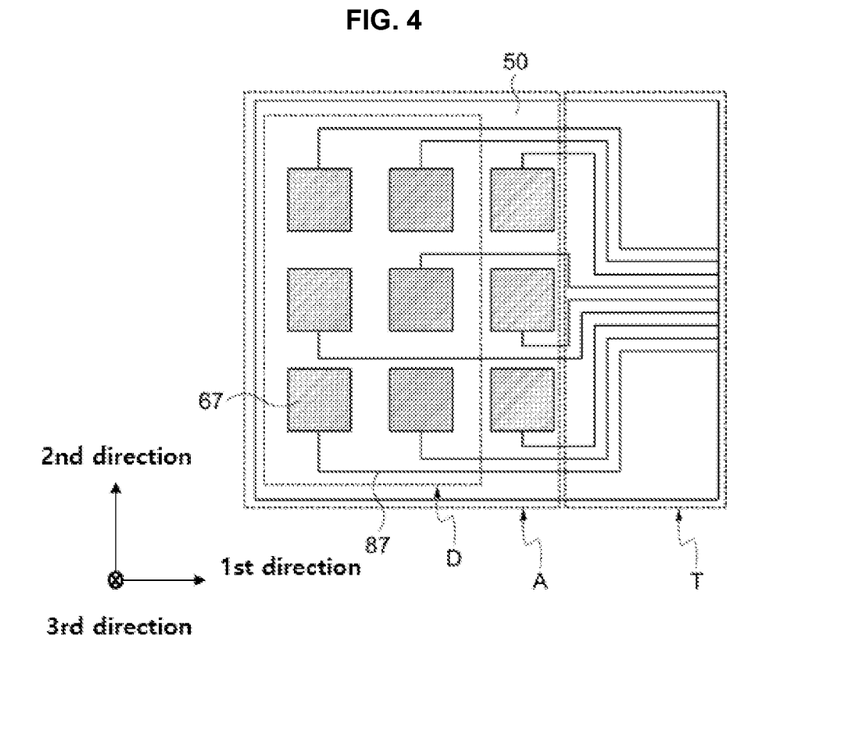
FIG. 4 is a schematic top-planar view illustrating a touch sensor module in accordance with some exemplary embodiments.

FIG. 4 is a schematic top-planar view illustrating a touch sensor module in accordance with some exemplary embodiments.

Referring to FIG. 4, sensing electrodes 67 and traces 87 of the touch sensor layer 120 may be arranged to be operable in a self-capacitance type.

The touch sensor layer 120 may include the sensing electrodes 67 each of which may be provided in an independent island pattern. Additionally, the traces 87 may be branched from each sensing electrode 67 to extend to the trace area T. End portions of the traces 87 may be collected in the connection area and may be electrically connected to the flexible circuit board 140.

As described above, the upper supporting structure 150 may commonly cover and support the touch sensor layer 120 and the flexible circuit board 140 while covering the trace area T and a portion of the active area A. A bending may be initiated from a portion of the active area A except for the display area D, and the trace area T may substantially face the display area D after the bending.

Figure 5:
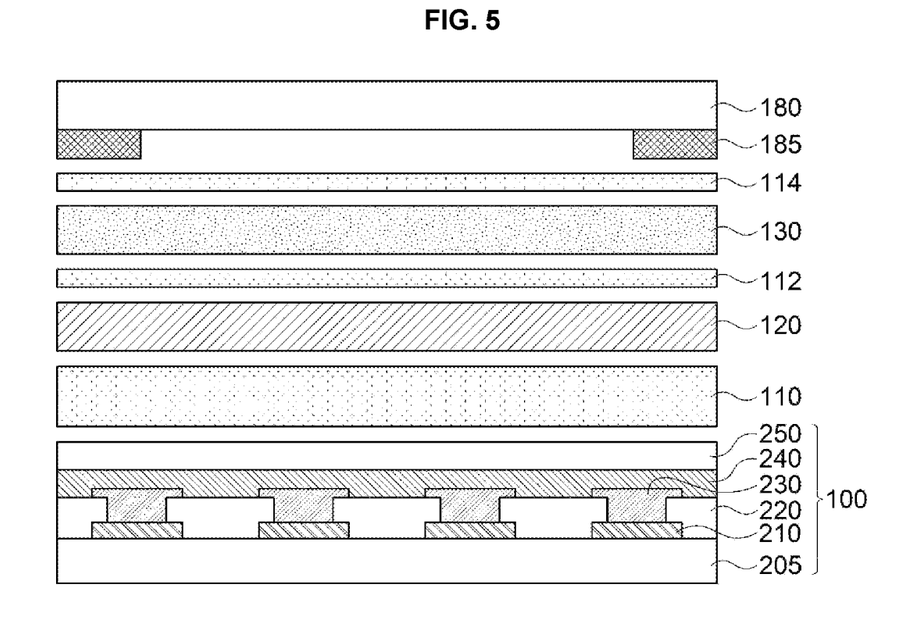
FIG. 5 is a schematic cross-sectional view illustrating an image display device including a flexible display module in accordance with exemplary embodiments.

FIG. 5 is a schematic cross-sectional view illustrating an image display device including a flexible display module in accordance with exemplary embodiments.

The image display device may be a flexible display device, and may include a window substrate 180 and the flexible display module as described above.

The flexible display module may include, e.g., the display panel 100 and the touch sensor layer 120 integrated with each other by the combining layer 110 as described with reference to FIGS. 1 and 2. The optical layer 130 may be stacked on the display area D of the touch sensor layer 120. For convenience of descriptions, illustration of the upper supporting structure 150 and the flexible circuit board 140 is omitted in FIG. 5.

The window substrate 180 may include, e.g., a hard coating film. In an embodiment, a light-shielding pattern 185 may be formed on a peripheral portion of one surface of the window substrate 180. The light-shielding pattern 185 may include, e.g., a color-printed pattern, and may have a single-layered or multi-layered structure. A bezel portion or a non-display area of the image display device may be defined by the light-shielding pattern 185.

The optical layer 130 may include various optical films or optical structures included in the image display device. In some embodiments, the optical layer 130 may include a coating-type polarizer or a polarizing plate. The coating-type polarizer may include a liquid crystal coating layer that may include a cross-linkable liquid crystal compound and a dichroic dye. In this case, the optical layer 130 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The optical layer 130 may be directly attached to the surface of the window substrate 180 or may be attached via a second adhesive layer 114. In an embodiment, the touch sensor layer 120 may be combined with the optical layer 130 via a first adhesive layer 112.

As illustrated in FIG. 5, the window substrate 180, the optical layer 130 and the touch sensor layer 120 may be sequentially positioned from a viewer's side. In this case, sensing electrodes of the touch sensor layer 120 may be disposed under the optical layer 130 including the polarizer or the polarizing plate so that electrode patterns may be effectively prevented from being seen by the viewer.

The display panel 100 may include a pixel electrode 210, a pixel defining layer 220, a display layer 230, an opposing electrode 240 and an encapsulation layer 250 disposed on a panel substrate 205.

The panel substrate 205 may include a flexible resin material. In this case, the image display device may be a flexible display.

A pixel circuit including a thin film transistor (TFT) may be formed on the panel substrate 205, and an insulation layer covering the pixel circuit may be formed. The pixel electrode 210 may be electrically connected to, e.g., a drain electrode of the TFT on the insulation layer.

The pixel defining layer 220 may be formed on the insulation layer, and the pixel electrode 210 may be exposed through the pixel defining layer 220 such that a pixel region may be defined. The display layer 230 may be formed on the pixel electrode 210, and the display layer 230 may include, e.g., a liquid crystal layer or an organic light emitting layer.

The opposing electrode 240 may be disposed on the pixel defining layer 220 and the display layer 230. The opposing electrode 240 may serve as, e.g., a common electrode or a cathode of the image display device. The encapsulation layer 250 may be disposed on the opposing electrode 240 to protect the display panel 200.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Example 1

A touch sensor sample (manufactured by Dongwoo Fine-Chem) including electrode patterns and traces that had a thickness of 0.14 μm and was formed of ITO, and a 20 μm PET protective film was prepared. The touch sensor sample was attached to a substrate for a display panel (thickness: 40 μm) containing polyimide using an adhesive sheet as a combining layer (thickness: 50 μm) prepared as described below.

Specifically, a monomer mixture including 35 parts by weight of ethyl hexyl acrylate, 25 parts by weight of ethyl hexyl methacrylate and 40 parts by weight of isobornyl acrylate was input in a 1 L reactor equipped with a cooling device capable of refluxing a nitrogen gas and controlling a temperature. After injecting, the nitrogen gas was purged for 1 hour to remove oxygen, and then maintained at 80° C. After uniformly mixing the monomer mixture, 0.5 parts by weight of 1-hydroxy-cyclohexyl-phenyl-ketone was added as a photo-initiator based on 100 parts by weight of a total weight of the monomer mixture. While being stirred, a UV lamp (10 mW) was irradiated to prepare an acrylic syrup having a resin conversion rate of 25%.

0.5 parts by weight of 2,4,6-trimethylbenzoyldiphenyl phosphine oxide as a photo-polymerization initiator was added to 100 parts by weight of the acrylic syrup, and the stirred and defoamed to form a preliminary coating film on a release film. An additional release film was adhered onto the preliminary coating film, and UVA 3000 mJ was irradiated through a high-pressure mercury lamp to prepare an adhesive sheet.

A polarizing plate including a polyvinyl alcohol (PVA) polarizer having a thickness of 10 μm and a TAC protective film having a thickness of 80 μm was attached at a central portion of the touch sensor layer.

The traces at a terminal end of the touch sensor layer were connected to an FPCB, and an upper supporting structure was attached so as to cover the flexible circuit board together with an end portion of the touch sensor layer that was not covered by the polarizing plate. Nitto Denko's acrylic tape (product number: 360A) was cut and used as the upper supporting structure.

Examples 2-5 and Comparative Example

Flexible display module samples were prepared in the same method as that in Example 1, except that a composition of the monomer mixture and an amount of a light irradiation when forming the adhesive sheet for the combining layer were changed to modify an elastic modulus, an adhesive force and a moisture permeability, as shown in Table 1 below.

Methods of measuring the elastic modulus, the adhesive force and the moisture permeability were as follows:

1) Measurement of Elastic Modulus

Storage modulus at 25° C. of the adhesive sheet used in each of Examples and Comparative Examples was measured using a viscoelasticity measuring device (MCR-301, Anton Paar). A size of the adhesive sheet sample was 30 mm length×30 mm width, and a measurement sample was bonded to a glass substrate and then bonded to a measurement tip. The storage modulus was measured in a temperature range of −30 to 100° C. under conditions including a frequency of 1.0 Hz, a deformation ratio of 2% and an increasing rate of temperature at 5° C./min, and a value measured at 25° C. was determined as the elastic modulus.

2) Measurement of Moisture Permeability

The adhesive sheet used in each of Examples and Comparative Examples was bonded to a 25 μm TAC film and measured at 40° C./90% based on standards of ASTM F1249.

3) Measurement of Adhesive Force

After peeling off the release film attached to one surface of the adhesive sheet used in each of Examples and Comparative Examples and performing a corona surface treatment, the adhesive sheet was bonded a 38 um PET film, and then cut to prepare a specimen having a width of 25 mm and a length of 100 mm. Subsequently, the release film attached to the other surface of the adhesive layer was peeled off, the adhesive sheet was attached to a soda glass using 2 kg roller according to JIS Z 0237, and then autoclaved (50° C., 5 atm) by pressing for about 20 minutes to prepare a sample.

Thereafter, an adhesive force when the sample was left for 1 hour at 23° C. and 50 RH % and the adhesive layer was peeled from the soda glass at a peeling angle of 180° and a peeling rate of 300 mm/min was measured using an autograph (AG-1S, SHIMADZU).

TABLE 1

|  | Example 1 | Example 2 | Example 3 | Example 4 | Example 5 |
|---|---|---|---|---|---|
| Thickness (μm) | 25 | 50 | 25 | 25 | 50 |
| Elastic Modulus (MPa) | 1.0 | 1.0 | 1.2 | 0.8 | 1.2 |
| Moisture Permeability (g/m² 24 hr) | 200 | 100 | 180 | 220 | 120 |
| Adhesive Force (N/25 mm) | 20.2 | 21.8 | 18.2 | 22.4 | 23.5 |

TABLE 2

|  | Comparative Example 1 | Comparative Example 2 | Comparative Example 3 | Comparative Example 4 | Comparative Example 5 |
|---|---|---|---|---|---|
| Thickness (μm) | 25 | 25 | 50 | 25 | 25 |
| Elastic Modulus (MPa) | 5.5 | 6.1 | 6.1 | 5.5 | 2.0 |
| Moisture Permeability (g/m² 24 hr) | 600 | 800 | 550 | 200 | 600 |
| Adhesive Force (N/25 mm) | 12.2 | 15.5 | 5.2 | 11.1 | 9.8 |

Experimental Example

A bending test at room temperature for 720 hr. was performed using a 0.5R bending evaluation jig for each flexible display module of the above-described Examples and Comparative Examples.

After the bending test, a delamination at the bonding area where the flexible circuit board (FPCB) was combined and cracks of the traces included in the touch sensor layer were observed. In Table 3 below, the result when the delamination and the cracks were not observed is represented as "O", the result when the delamination/cracks were detected is represented as "NG".

Further, a touch sensor driving was tested after the bending test using a touch sensor function tester. Specifically, in Table 3 below, the result when the sensing function was maintained is represented as "O", and the result when the sensing function was not implemented is represented as "NG".

TABLE 3

|  | FPCB Delamination | Cracks in Traces | Touch Sensing Function |
|---|---|---|---|
| Example 1 | OK | OK | OK |
| Example 2 | OK | OK | OK |
| Example 3 | OK | OK | OK |
| Example 4 | OK | OK | OK |
| Example 5 | OK | OK | OK |
| Comparative Example 1 | NG | NG | NG |
| Comparative Example 2 | NG | NG | NG |
| Comparative Example 3 | NG | NG | NG |
| Comparative Example 4 | NG | NG | OK |
| Comparative Example 5 | NG | NG | NG |

Referring to Table 3, in Examples including the combining layer having values of the elastic modulus and the moisture permeability in the above-described range, the touch sensing function was maintained while maintaining stability of the flexible circuit board and the touch sensor layer.

In Comparative Examples where the elastic modulus of the combining layer exceeded 0.1 to 5 MPa or the moisture permeability exceeded 500 g/m$^2$·24 hr, delamination or structural damages were caused, or the touch sensing function was not substantially implemented.

What is claimed is:

1. A flexible display module, comprising:
   a display panel;
   a touch sensor layer disposed on the display panel, the touch sensor layer comprising sensing electrodes and traces extending from the sensing electrodes;
   a combining layer by which the display panel and the touch sensor layer are combined with each other, the combining layer having an elastic modulus in a range from 0.1 to 5 MPa and a moisture permeability in a range from 500 g/m2.24 hr or less;
   a flexible circuit board electrically connected to the traces at an end portion of the touch sensor layer; and
   an upper supporting structure that commonly and partially covers the flexible circuit board and the touch sensor layer, the upper supporting structure directly contacting top surfaces of the flexible circuit board and the touch sensor layer,
   wherein end portions of the display panel and the touch sensor layer are bent together with the upper supporting structure.

2. The flexible display module according to claim 1, wherein the combining layer includes an adhesive layer formed from an acrylic monomer mixture.

3. The flexible display module according to claim 1, wherein the elastic modulus of the combining layer is in a range from 0.5 to 2 MPa.

4. The flexible display module according to claim 1, wherein the moisture permeability of the combining layer is in a range from 10 to 200 g/m2.24 hr.

5. The flexible display module according to claim 1, wherein the combining layer has an adhesive force of 1 N/25 mm or more.

6. The flexible display module according to claim 1, wherein a thickness of the combining layer is greater than each thickness of the display panel and the touch sensor layer.

7. The flexible display module according to claim 1, wherein a thickness of the combining layer is in a range from 5 to 100 µm.

8. The flexible display module according to claim 1, wherein the touch sensor layer includes an active area in which the sensing electrodes are arranged and a trace area in which the traces are arranged, and a bending is initiated from a portion of the active area adjacent to the trace area.

9. The flexible display module according to claim 8, wherein a curvature of bent portions of the display panel and the touch sensor layer is in a range from 0.1R to 0.5R with respect to a radius of curvature R.

10. The flexible display module according to claim 8, wherein the active area includes a display area, and the bending initiated from a portion of the active area between the display area and the trace area.

11. The flexible display module according to claim 10, further comprising an optical layer selectively disposed on the display area of the touch sensor layer.

12. The flexible display module according to claim 11, wherein the upper supporting structure covers the trace area and a portion of the active area on which the optical layer is not formed.

13. The flexible display module according to claim 11, wherein the end portions of the display panel and the touch sensor layer are bent such that the flexible circuit board and the optical layer face each other.

14. The flexible display module according to claim 13, further comprising a lower supporting structure disposed between portions of the display panel that overlap the optical layer and the flexible circuit board facing each other.

15. The flexible display module according to claim 11, wherein the optical layer includes at least one of a polarizer, a polarizing plate, a retardation film, a reflective sheet, a brightness enhancing film or a refractive index matching film.

16. The flexible display module according to claim 1, wherein the display panel comprises an organic light emitting diode (OLED) panel.

17. An image display device, comprising:
    the flexible display module according to claim 1; and
    a window substrate disposed on the flexible display module.

18. The image display device according to claim 17, further comprising a main board disposed under the flexible display module,
    wherein the flexible circuit board of the flexible display module is electrically connected to the main board.

* * * * *